(12) United States Patent
Milligan

(10) Patent No.: US 6,635,940 B1
(45) Date of Patent: Oct. 21, 2003

(54) MICRO-ELECTROMECHANICAL ACTUATOR AND METHODS OF USE

(75) Inventor: Donald J. Milligan, Corvallis, OR (US)

(73) Assignee: Hewlett-Packard Development Company, L.P., Fort Collins, CO (US)

( * ) Notice: Subject to any disclaimer, the term of this patent is extended or adjusted under 35 U.S.C. 154(b) by 5 days.

(21) Appl. No.: 10/128,782

(22) Filed: Apr. 23, 2002

(51) Int. Cl.<sup>7</sup> ............................................... H01L 29/82
(52) U.S. Cl. ........................................ 257/415; 257/48
(58) Field of Search ................................. 257/48, 415

(56) References Cited

U.S. PATENT DOCUMENTS

| | | | |
|---|---|---|---|
| 5,786,621 A | * | 7/1998 | Saif et al. .................... 257/415 |
| 5,882,532 A | | 3/1999 | Field et al. |
| 6,289,030 B1 | | 9/2001 | Charles |
| 6,303,042 B1 | | 10/2001 | Hawkins et al. |
| 6,307,452 B1 | | 10/2001 | Sun |
| 6,318,384 B1 | | 11/2001 | Khan et al. |
| 6,396,368 B1 | * | 5/2002 | Chow et al. ................. 333/262 |

* cited by examiner

Primary Examiner—Jerome Jackson

(57) ABSTRACT

A micro-electromechanical actuator and related methods of use that use a pair of electrodes separated by a linkage. The linkage is biased to a neutral position wherein the electrodes are spaced apart from each other, but also allows at least one electrode to move toward the other electrode when an appropriate force, such as voltage from the power source, is applied to the electrodes. The linkage is sized and shaped to allow the electrodes to move together when a defined threshold voltage is applied by the power source, thereby allowing the micro-electromechanical actuator to function as a manufacturing quality testing device or a micromechanical actuator in other applications. The actuator may be fabricated simultaneously with other micromechanical and micro-electromechanical components on the same substrate using conventional semi-conductor and micro-machining manufacturing equipment.

39 Claims, 4 Drawing Sheets

MICRO-ELECTROMECHANICAL ACTUATOR AND METHODS OF USE

TECHNICAL FIELD

This invention relates to micro-machined, electromechanical devices, their uses and their fabrication.

BACKGROUND OF THE INVENTION

Micro-machined mechanical and electromechanical devices are used in a wide variety of applications. For example, known applications of such structures include ink ejecting devices on printheads and some gimbals used to mount the record/playback head in the actuator arm of a hard disk drive. A wide variety of other applications for such devices are also either currently available or will likely become available in the near future.

The typical micro-machined mechanical device is constructed of one or more very small components fabricated from a single-crystal silicon substrate, or the like. Such substrates are well known for use in the manufacture of semiconductors, where they are usually formed into substantially circular disks that are commonly known as silicon wafers.

Silicon substrates such as wafers are particularly well adapted for use in flexible, micro-machined mechanical and electromechanical devices. Such substrates have a Young's modulus similar to that of steel, and when formed into the thickness of a traditional silicon wafer, they also are flexible and resilient. Moreover, the semiconductor industry's manufacturing equipment can be readily adapted to mass-produce such devices at low cost. Accordingly, literally thousands of micro-machined components can be manufactured using a single wafer.

Two critical elements of effective micromechanical component construction are 1) ensuring that the flexibility of the substrate is within acceptable limits; and 2) ensuring that the manufacturing techniques, such as precise etching at defined locations on the substrate, have been properly performed. Components manufactured with either of these critical elements missing or out of tolerance will not likely operate effectively.

Silicon wafer flexibility testing devices are available. For example, rotors and stators have been spaced apart from each other, bonded to a wafer, and operably connected to an electrical system such that the rotors and stators operate like a magnetic actuator when power is applied to the rotors and stators. The amount of voltage required to move the rotors and stators toward each other is proportional to the flexibility of the wafer. Accordingly, the flexibility of that particular wafer can be determined based on the determining the amount of voltage required to move the rotors and stators together.

While such devices allow the flexibility of that particular wafer to be determined, the physical bonding of the stators and rotors to the silicon wafer is time consuming and generally destroys a large portion of the silicon wafer. Accordingly, it is economically unfeasible to bond these devices to every wafer used to manufacture micromechanical components. Therefore, only a few wafers from a batch of wafers are usually tested. The remaining wafers in the batch are simply assumed to have the flexibility characteristics of the tested wafers from that batch.

In practice, the process of making wafers can lead to discrepancies in the flexibility of individual wafers in a given batch. Such individual discrepancies would not likely be caught using bonded test devices as described. Moreover, the bonded test devices are limited to only providing flexibility information about the wafer they are attached to. Bonded test devices do not assist with determining whether manufacturing tolerances have been maintained on a given silicon wafer.

SUMMARY OF THE INVENTION

The present invention is a micro-electromechanical actuator and related methods of use and fabrication that include a pair of electrodes separated by a linkage. The linkage is biased to a neutral position wherein the electrodes are spaced apart from each other, but also allows at least one electrode to move toward the other electrode when an appropriate force, such as voltage from the power source, is applied to the electrodes. The linkage is sized and shaped to allow the electrodes to move together when a defined threshold voltage is applied by the power source. The micro-electromechanical actuator can be used in a variety of applications, such as a test device or a simple in-plane actuator in other devices.

DETAILED DESCRIPTION

A micro-electromechanical actuator 10 that is preferably micro-machined into a small or non-essential area of a fabrication wafer 12 using conventional semiconductor manufacturing equipment is disclosed in FIGS. 1–5. The actuator 10 includes a linkage 14 containing a pair of electrodes that can be operably secured to a power source. The linkage 14 is sized and shaped to allow the electrodes to move together when a defined threshold voltage is applied by the power source.

A. Micro-Electromechanical Actuator

Figure 1:
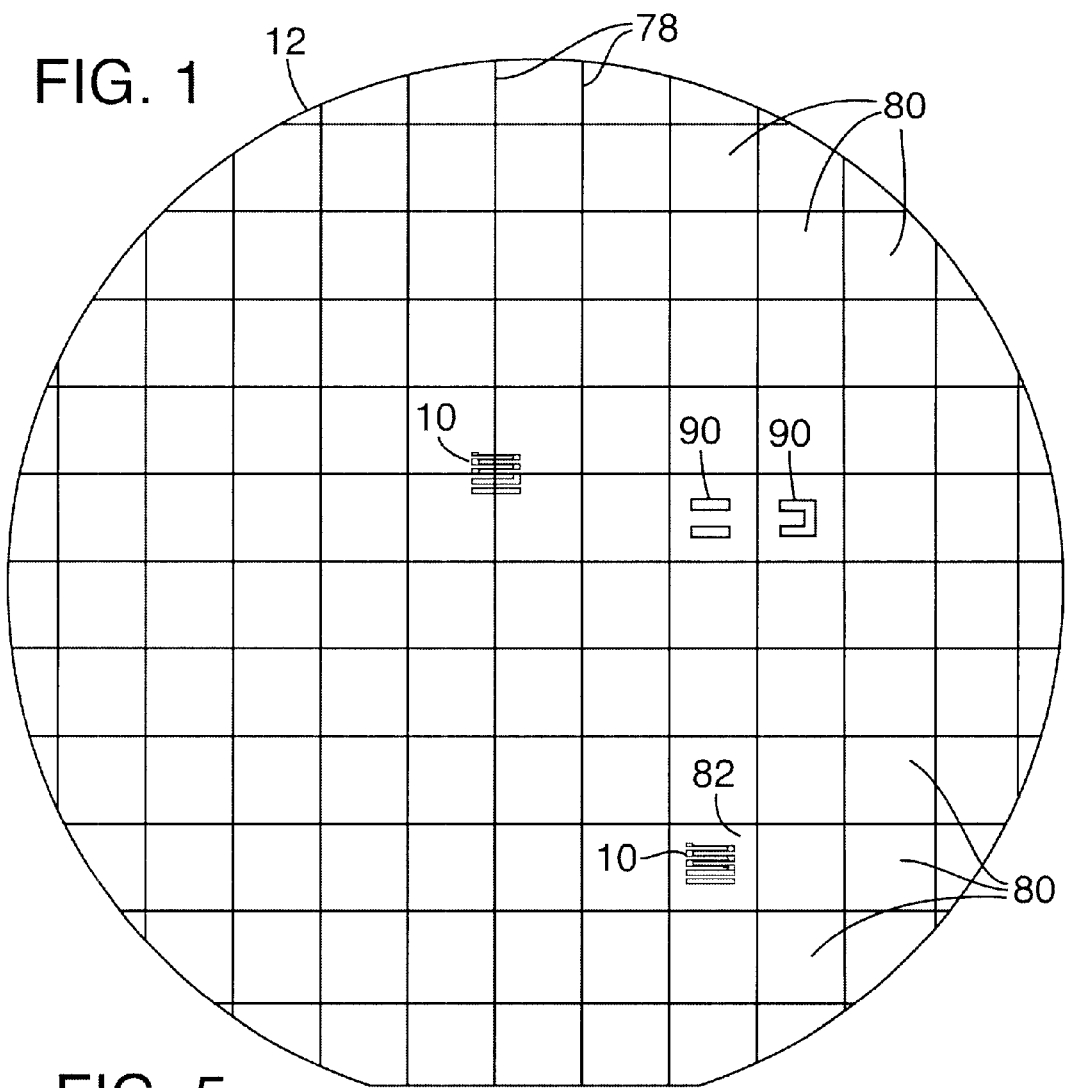
FIG. 1 is an exemplar top plan view of a fabrication wafer having a plurality of micro-mechanical and micro-electromechanical devices therein including at least one micro-electromechanical actuator in accordance with an embodiment of the present invention. The micro-mechanical and micro-electromechanical devices have been enlarged to show detail.
Figure 5:
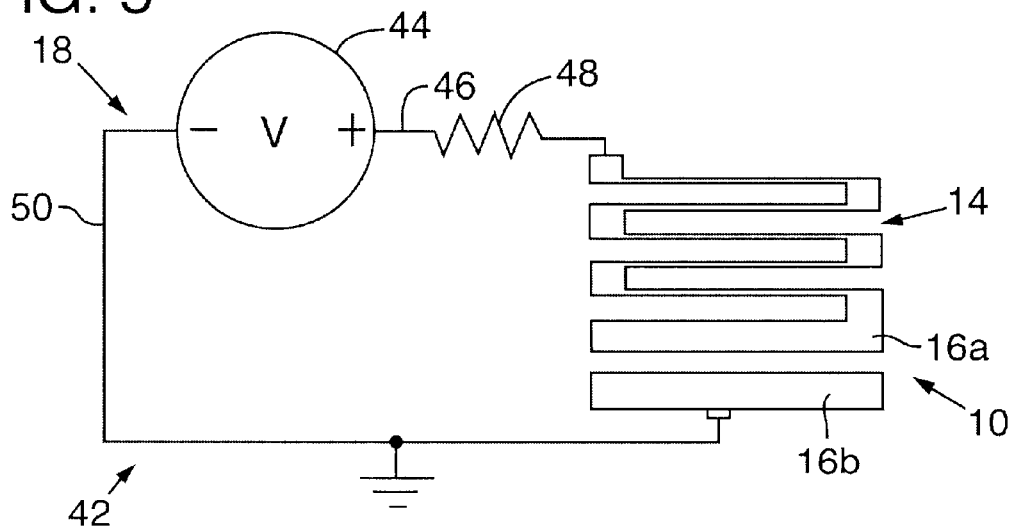
FIG. 5 is a schematic diagram of an electrical system for powering the micro-electromechanical device in accordance with an embodiment of the present invention.
Figure 2:
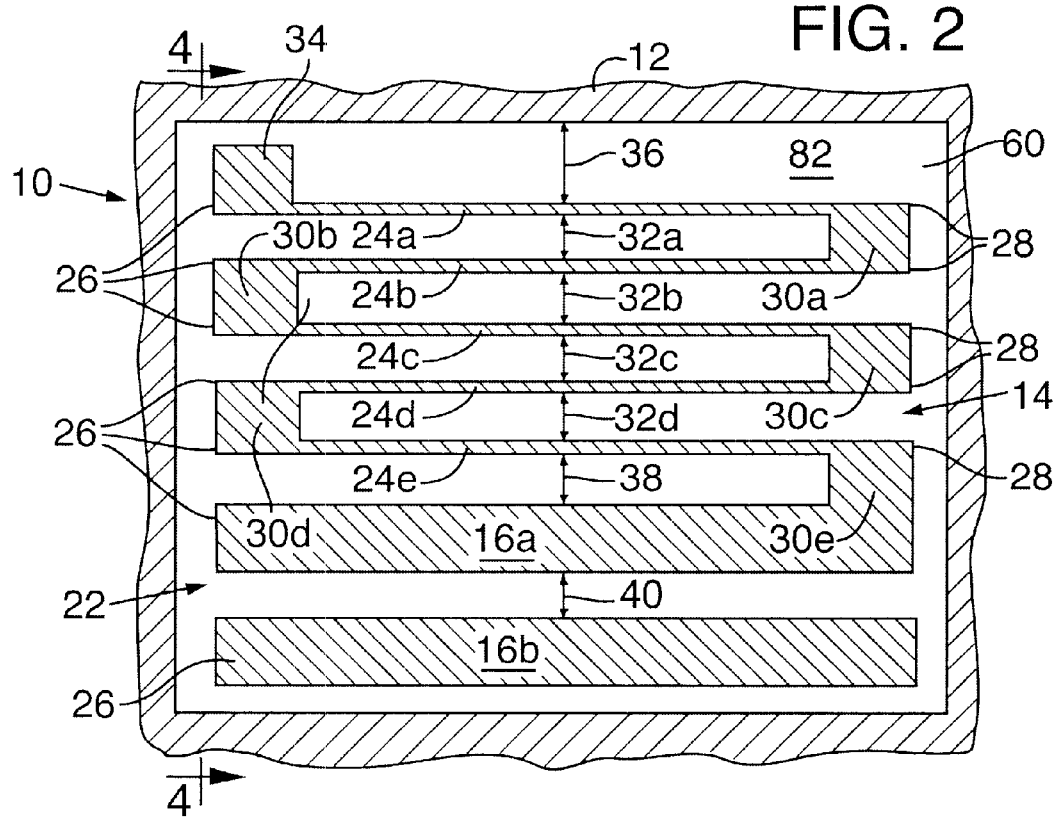
FIG. 2 is a top view of the micro-electromechanical actuator in accordance with an embodiment of the present invention.
Figure 3:
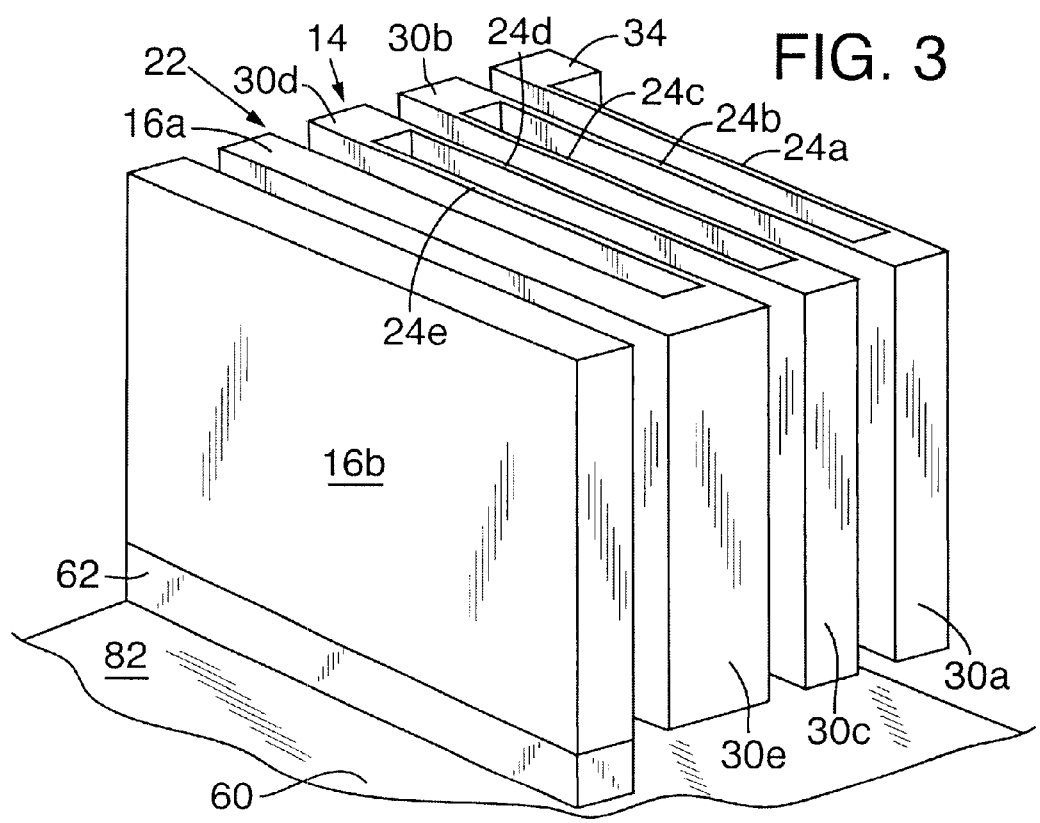
FIG. 3 is an isometric view of the micro-electromechanical actuator of FIG. 2.

As shown in FIG. 1, at least one micro-electromechanical actuator 10 is formed within the fabrication wafer 12, which is preferably a 100 μm single-crystal silicon wafer with appropriate impurities to allow the electrical conduction as described herein. As best shown in FIGS. 2 and 3, the actuator 10 includes a linkage 14 containing a first electrode 16a operably secured to a power source 18 (FIG. 5). A second electrode 16b is operably secured to either a handle wafer 60 as shown in FIG. 3, or the fabrication wafer 12 (attachment not shown). The linkage is biased to a neutral position 22 (FIGS. 2 & 3) wherein the electrodes 16a, 16b are spaced apart from each other, but also allows the first electrode 16a to move toward the second electrode 16b in the direction of arrow 61 (FIG. 4E) when an appropriate force, such as voltage from the power source 18, is applied to the electrodes 16a, 16b. The linkage 14 is sized and shaped to allow the electrodes 16a, 16b to move together when a defined threshold voltage is applied by the power source 18.

One such linkage 14 that allows the electrodes 16a, 16b to move as described and that also can be made in the fabrication wafer 12 using traditional silicon wafer manufacturing equipment is shown in FIGS. 2 & 3. The linkage 14 includes a generally serpentine pattern formed of five spaced apart and substantially parallel elongate beams 24a–e each having a first end 26 and a second end 28 defining a neutral position 22 as shown. The beams 24a–e are joined together such that the second end 28 of the first beam 24a is joined to the second end 28 of the second beam 24b at spacer portion 30a, and the second end 28 of the third beam 24c is joined to the second end 28 of the fourth beam 24d at spacer portion 30c. Likewise, the first end 26 of the second beam 24b and the first end 26 of the third beam 24c are joined together at spacer portion 30b, and the first end 26 of the fourth beam 24d and the first end 26 of the fifth beam 24e are joined together at spacer portion 30d. Accordingly, there are defined spaces 32a–d between the beams.

Figure 4A:
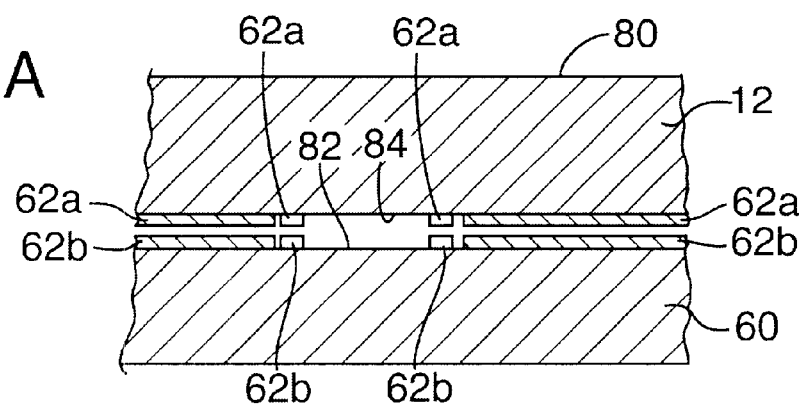
FIGS. 4A–E is a possible manufacturing process that may be used to manufacture the micro-mechanical and micro-electromechanical devices of FIG. 1.
Figure 4B:
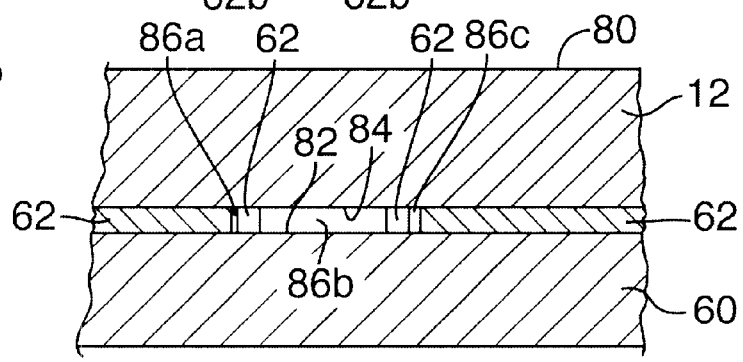

Preferably, the first end 26 of the first beam 24a is operably secured to either a handle wafer 60 at attachment portion 34, thereby defining space 36 (FIGS. 2 and 4E) between the fabrication wafer and the first beam 24a. The handle wafer 60 is preferably aligned substantially parallel to the fabrication wafer 12 as best shown in FIG. 4E. Similarly, the first electrode 16a, which is preferably an elongate beam having a first end 26 and second end 28 and aligned substantially parallel with the beams 24a–e, is operably secured to the second end 28 of the fifth beam 24e at spacer portion 30e, thereby defining space 38 therebetween. Alternatively, the attachment portion 34 may extend from the fabrication wafer 12 (extension not shown).

The second electrode 16b is spaced apart from the first electrode 16a and preferably secured to the handle wafer 60 as shown in FIG. 4E, or to the fabrication wafer 12 (attachment not shown) in a substantially fixed orientation. More preferably, the second electrode 16b is an elongate beam having overall dimensions substantially similar to those of the first electrode 16a, and the second electrode 16b is aligned substantially parallel to the first electrode when the linkage 14 is in its neutral position 22 (FIGS. 2 & 3).

Preferably, the linkage 14 and fabrication wafer 12 are operably secured to the handle wafer 60 such that the linkage 14 operates much like a conventional compression spring, thereby allowing the linkage 14 to be laterally pulled in the direction of arrow 61 (FIG. 4E). Accordingly, the linkage 14 allows the first electrode 16a to be moved toward the second electrode 16b in response to an appropriate applied force.

Applying a voltage to the electrodes 16a, 16b will urge them together. A possible power source 18 includes a voltage application circuit 42 as shown schematically in FIG. 5. A voltage generator 44 is operably secured to the micro-electromechanical actuator 10, preferably through a conductive intermediate layer 62 sandwiched between the fabrication wafer 12 and handle wafer 60 as best shown in FIG. 4E. Referring to FIG. 5, the positive lead 46 from the voltage generator 44 is preferably passed through a resistor 48 and operably connected to the first electrode 16a. Similarly, the negative lead 50 from the voltage generator 44 is grounded and connected to the second electrode 16b. The resistor 48 in series with the first electrode 16a is preferable to regulate the current when the first and second electrodes 16a, 16b contact each other.

Preferably, the voltage generator 44 and resistor 48 are detachably secured to the electrodes 16a, 16b. For example, the voltage regulator 18 (FIG. 5) containing a voltage source 44 and resistor 48 can be detachably secured to the conductive intermediate layer 62 such as by allowing probes (not shown) from the voltage regulator 18 to simultaneously contact respective portions of the conductive intermediate bonding layer 62.

The shape and size of the beams 24a–e, spacer portions 30a–e, and attachment portion 34 are sized for a fabrication wafer 12 having a defined flexibility, such that the linkage 14 will resist movement until a minimum defined voltage is applied to the electrodes 16a, 16b. Such flexibility is also known as the in-plane flexure stiffness.

These measurements may be obtained for a given fabrication wafer 12 flexibility knowing the Young's modulus of the fabrication wafer 12 and the dimensions of the linkage 14 and electrodes 16a, 16b, and using conventional finite element analysis calculations. For example, if the fabrication wafer 12 is a 100 $\mu$m single-crystal silicon wafer, and the linkage 14 is sized such that the defined distance 40 between the first and second electrodes and spaces 32a–d, 38 and 36 are all about 25 $\mu$m when the linkage 14 is in its neutral position 22 (FIGS. 2 & 3), a threshold voltage of 43 volts must be applied to the electrodes 16a, 16b for the linkage 14 to move so that the first electrode 16a contacts the second electrode 16b when the overall width of the linkage 14 is 2.5 $\mu$m. The threshold voltage increases to 122 volts when the overall width of the linkage 14 is increased to 5.0 $\mu$m.

B. Exemplar Micro-Machining Manufacturing Process

The micro-electromechanical actuator 10 is preferably manufactured at the same time as other micro-mechanical devices 90 (FIG. 1) on the fabrication wafer 12 using the same conventional semi-conductor and micro-machining manufacturing equipment. An exemplar manufacturing process is shown in FIGS. 4A–4E.

Thin micromechanical devices 90 and the actuator 10 can be made in a way that is mechanically compatible with wafer handling for conventional-thickness wafers. Referring to FIG. 4A, a fabrication wafer 12, which is preferably a conventional silicon wafer, and a substantially conventional-thickness handle wafer 60 are provided. As shown in FIG. 4B, the fabrication wafer 12 is bonded to the handle wafer 60 by the conductive intermediate bonding layer 62. Preferably, the handle wafer is constructed of a non-electrically conductive material.

One way to form the conductive intermediate bonding layer 62 is shown in FIG. 4A. This method includes coating the lower surface 84 of the fabrication wafer 12 with a first bonding agent 62a, and coating the upper surface 82 of the handle wafer 60 with a second bonding agent 62b. The first and second bonding agents 62a, 62b, are selected so that when joined together they form a bond. For example, one of the bonding agents can be Palladium (Pd), which is a conductive material, while the other boding agent can be polysilicon.

The two bonding agents 62a, 62b are joined together and heated to form a uniform, conductive bond 62 where the two agents 62a, 62b meet. More preferably, the two agents 62a, 62b are selectively deposited on their respective surfaces 84, 82 so that the agents 62a, 62b align with each other when joined, and also form defined openings 86a–c between the fabrication wafer 12 and the handle wafer 60 as best shown in FIG. 4B.

These openings 86a–c are aligned so that selected structures to be built into the fabrication wafer 12 remain unbonded to the handle wafer 60. For example, the attachment portion 34 of the linkage 14 is bonded to the handle wafer 60, but the remaining components of the linkage 14 remain unbonded, thereby allowing the linkage 14 to move as previously described. Opening 86a electrically isolates the attachment portion 34 and related first electrode 16a from other portions of the fabrication wafer 12 and other conductive bonds 62. Similarly, second electrode 16b is bonded to the handle wafer 60, but the associated bond is isolated from other conductive bonds through defined openings 86b, 86c, thereby electrically isolating the second electrode 16b from remaining portions of the fabrication wafer 12 and the other conductive bonds 62.

Figure 4C:
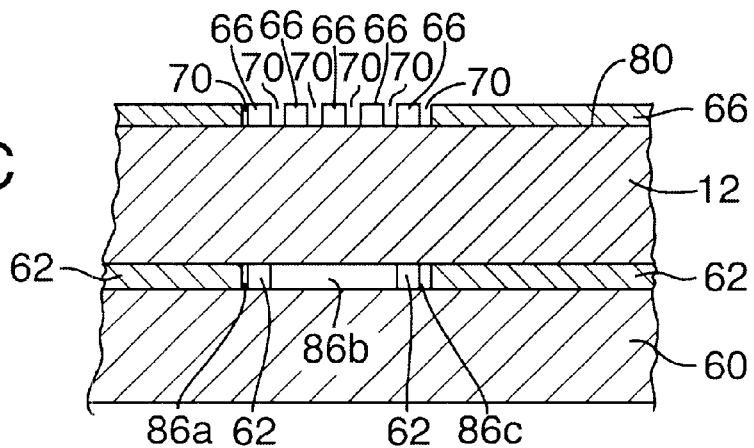
Figure 4D:
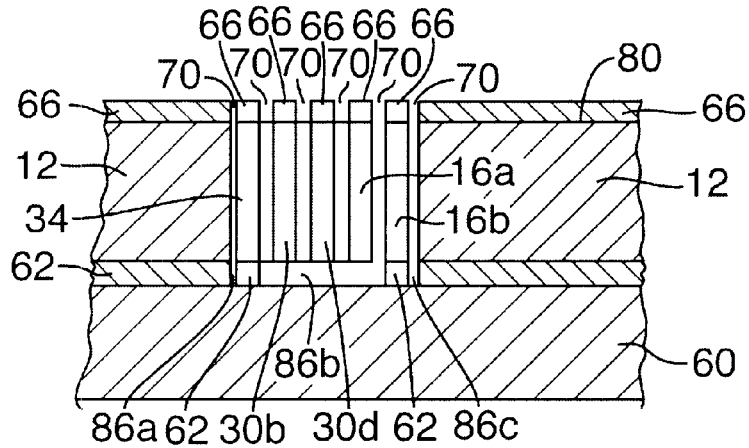
Figure 4E:
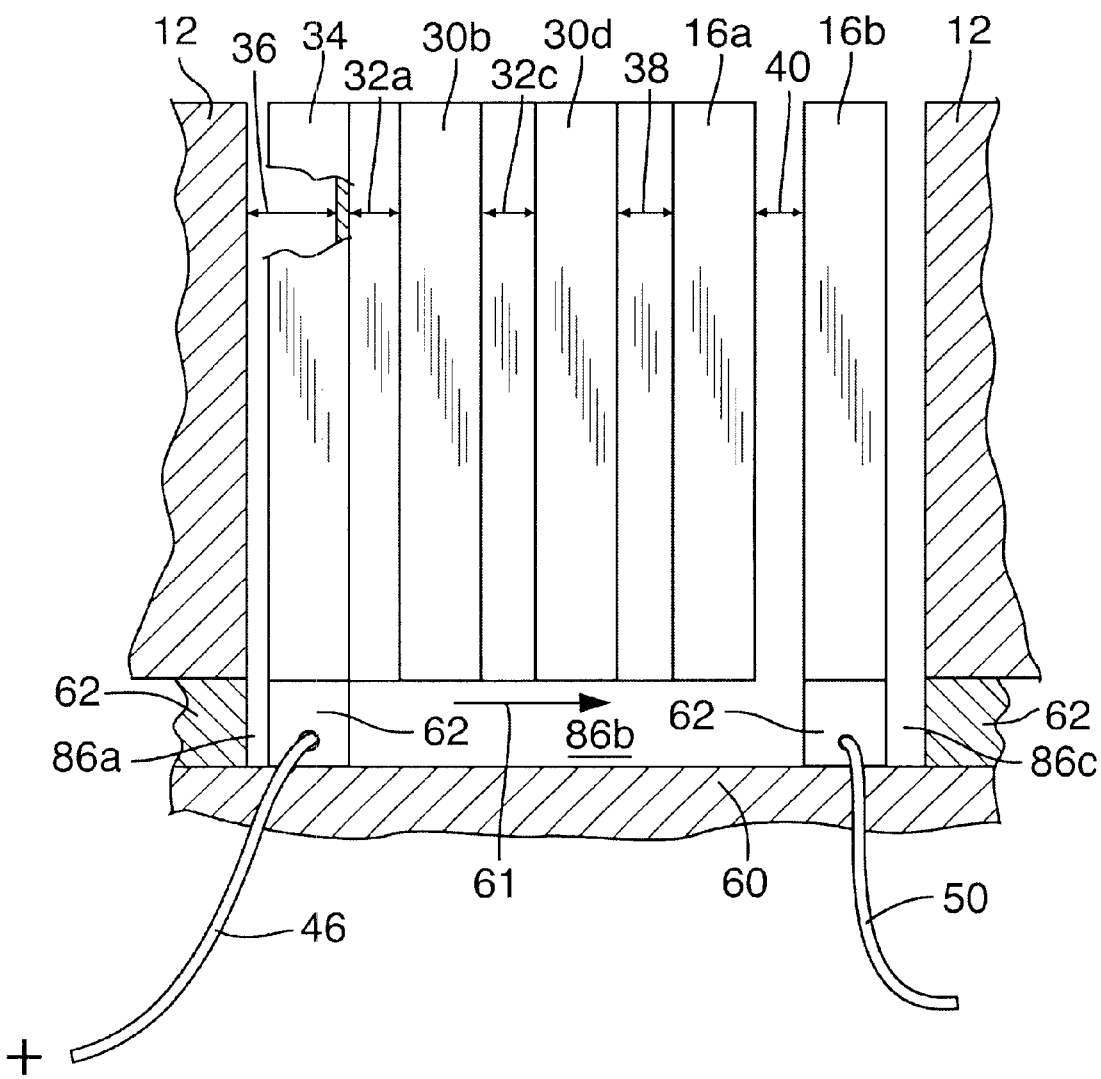

As shown in FIGS. 4C–E, the structures of the actuator 10 (FIG. 1) are then fabricated into the fabrication wafer 12. This is preferably done using conventional semi-conductor and micro-machining manufacturing equipment such as etching. For example, as shown in FIG. 4C, a layer of etch resist material 66 is applied to the upper surface 80 of the fabrication wafer 12. The fabrication wafer 12 is processed to deposit a defined pattern of the etch resist material 66 providing openings 70 therein. Preferably, the defined pattern is the top plane view shape of the linkage 14 as shown in FIG. 2, thereby masking that portion of the fabrication wafer 12 as shown in FIGS. 2 and 4C. The fabrication wafer 12 is then etched so that etch material travels down openings 70 to openings 86a–c, thereby defining the linkage 14 within the fabrication wafer 12 as shown in FIG. 4D. Finally, the etch resist material 66 is removed as shown in FIG. 4E, thereby forming the actuator 10.

The method according to the invention enables numerous micromechanical devices 90 (FIG. 1) to be made on each fabrication wafer 12, preferably simultaneously with the fabrication of the actuator 10. Moreover, the micro-electromechanical actuator 10 may be manufactured in non-essential portions of the fabrication wafer 12, such as on scribe lines 78 commonly known as "streets", or limited to only a small area of the fabrication wafer 12 such as a die 80, which may include other test devices therein as well. In such case the die 80 containing the test devices would be called a "test die" 82 or a "drop-out die."

C. Use and Operation

After the micro-electromechanical actuator 10 of the present invention is machined into a fabrication wafer 12, it may be readily used to test the flexibility of that particular fabrication wafer 12 and the manufacturing processes used on that particular fabrication wafer 12. A tester connects the electrodes 16a, 16b to the power source 18 as previously described, and sends a voltage at or slightly above the calculated threshold voltage to the electrodes 16a, 16b. If the linkage 14 is operating correctly, the applied voltage will urge the electrodes 16a, 16b together so they physically contact each other. In such event, the resistor 48 will limit the amount of current flowing through the circuit. If the circuit shorts when a voltage at or slightly above the threshold voltage, the flexibility of the fabrication wafer 12 and the manufacturing tolerances used to make the linkage 14 and the other micro-mechanical and micro-electromechanical devices 90 on that fabrication wafer 12 are within acceptable tolerances. If the circuit does not short when the threshold voltage is applied, one or both of these tolerances are out of acceptable limits and the entire group of micro-mechanical and micro-electromechanical components from that fabrication wafer 12 can be rejected before they are inserted into other components.

As an additional measure of testing accuracy, it is also desirable to apply a voltage slightly less than the threshold voltage to the electrodes 16a, 16b. With a linkage manufactured within acceptable flexibility and manufacturing tolerances, such voltage should not allow the electrodes to move together and short the system. If such a short does arise below the threshold voltage, the tester should also reject the fabrication wafer 12 and related micro-mechanical and micro-electromechanical components thereon as being outside of acceptable tolerances.

In addition to its testing function, the micro-electromechanical actuator 10 of the present invention can also be used as a simple in-plane actuator in other applications.

D. Alternative Embodiments

Having here described preferred embodiments of the present invention, it is anticipated that other modifications may be made thereto within the scope of the invention by individuals skilled in the art. For example, the disclosed actuator is separated from the fabrication wafer while remaining joined to the handle wafer. It can be appreciated that the attachment portion 34 and/or the second electrode 16b can remain secured to their adjacent fabrication wafer 12 so long as the first and second electrodes 16a, 16b remain electrically isolated from each other except for the conductive actuator operably secured between them. One such structure for electrically isolating such a structure includes operably securing non-conductive trenches and/or dielectric trenches within the fabrication wafer 12.

Thus, although several embodiments of the present invention have been described, it will be appreciated that the spirit and scope of the invention is not limited to those embodiments, but extend to the various modifications and equivalents as defined in the appended claims.

What is claimed is:

1. A micro-electromechanical actuator manufactured into a substantially planar substrate defining a plane, said actuator comprising:

a first electrode;

a second electrode operably secured to said substrate; and, a linkage operably secured to said first electrode and said substrate and having a neutral position, said linkage formed with a plurality of substantially planar members, at least one substantially planar member of said plurality of substantially planar members aligned substantially perpendicular to the plane;

wherein said first electrode and said second electrode are spaced apart from each other in said neutral position and said linkage moves along said plane to allow said first electrode to contact said second electrode when a voltage at or above a defined level is applied to the first and second electrodes.

2. The micro-electromechanical actuator manufactured into a substrate of claim 1, wherein said first and second electrodes remain spaced apart from each other when a voltage less than said defined level is applied to the electrodes.

3. The micro-electromechanical actuator manufactured into a substrate of claim 1, wherein said plurality of substantially planar members of said linkage define a substantially serpentine pattern.

4. The micro-electromechanical actuator manufactured into a substrate of claim 3, wherein said plurality of substantially planar members are aligned substantially parallel with each other and operably secured together with spacer portions.

5. A micro-electromechanical actuator manufactured into a substrate, said actuator comprising:
   a first electrode;
   a second electrode operably secured to said substrate;
   a serpentine-shaped linkage operably secured to said first electrode and said substrate, said serpentine-shaped linkage having five spaced apart beams aligned substantially parallel with each other and operably secured together with spacer portions defining a neutral position,
   said first electrode and said second electrode are spaced apart from each other in said neutral position and said linkage moves to allow said first electrode to contact said second electrode when a voltage at or above a defined level is applied to the first and second electrodes; and,
   said first electrode is a beam aligned substantially parallel to said five beams in said neutral position; and,
   wherein said first electrode and said second electrode are spaced apart from each other in said neutral position and said linkage moves to allow said first electrode to contact said second electrode when a voltage at or above a defined level is applied to the first and second electrodes.

6. The micro-electromechanical actuator manufactured into a substrate of claim 5, wherein said first electrode and said second electrode are spaced apart from each other by a defined distance in said neutral position.

7. The micro-electromechanical actuator manufactured into a substrate of claim 6, wherein said defined distance is about 25 $\mu$m.

8. The micro-electromechanical actuator manufactured into a substrate of claim 1, wherein said defined level of voltage is proportional to the flexibility of the substrate, and said actuator is used to test the flexibility of the substrate.

9. The micro-electromechanical actuator manufactured into a substrate of claim 8, wherein said micro-electromechanical actuator is manufactured using the same manufacturing equipment as used to manufacture other micro-mechanical devices on the substrate; and,
   whereby said actuator also tests whether correct manufacturing processes were performed on said substrate.

10. The micro-electromechanical actuator manufactured into a substrate of claim 9, wherein said micro-electromechanical actuator is manufactured concurrently with said other micro-mechanical devices on the substrate.

11. The micro-electromechanical actuator manufactured into a substrate of claim 1, wherein said substrate is a single crystal silicon wafer.

12. A micro-electromechanical actuator manufactured into a single crystal silicon wafer, said actuator comprising:
   a first electrode;
   a second electrode operably secured to said silicon wafer;
   a linkage operably secured to said first electrode and said silicon wafer and having a neutral position;
   wherein said first electrode and said second electrode are spaced apart from each other in said neutral position and said linkage moves to allow said first electrode to contact said second electrode when a voltage at or above a defined level is applied to the first and second electrodes; and,
   wherein, said micro-electromechanical actuator Is formed on a scribe fine on said silicon wafer.

13. The micro-electromechanical actuator manufactured into a substrate of claim 1, further including means for connecting a voltage generator to said first and second electrodes.

14. A micro-electromechanical actuator manufactured into a substrate, said actuator comprising:
   a first electrode;
   a second electrode operably secured to said substrate;
   a linkage operably secured to said first electrode and said substrate and having a neutral position;
   wherein said first electrode and said second electrode are spaced apart from each other in said neutral position and said linkage moves to allow said first electrode to contact said second electrode when a voltage at or above a defined level is applied to the first and second electrodes;
   means for connecting a voltage generator to said first and second electrodes; and,
   a resistor electrically secured in series to said first electrode.

15. The micro-electromechanical actuator manufactured into a substrate of claim 1, further including a handle wafer operably secured to said substrate, and said micro-electromechanical actuator is operably secured to said handle wafer.

16. The micro-electromechanical actuator manufactured into a substrate of claim 15, wherein a conductive bonding layer operably secures said micro-electromechanical actuator to said handle wafer.

17. A testing device for determining if a plurality of spaced-apart micro-mechanical or micro-electromechanical devices formed using a flexible substrate have been manufactured within acceptable manufacturing tolerances, said testing device including:
   a linkage formed of said substrate and spaced apart from the plurality of devices, said linkage having a neutral position;
   a first electrode secured to said linkage; and,
   a second electrode operably secured to said substrate;
   wherein said first electrode and said second electrode are spaced apart from each other in said neutral position and said linkage moves to allow said first electrode to contact said second electrode when a voltage at a defined level is applied to the first and second electrodes, said defined level of voltage being proportional to the shape of the linkage for a given flexibility of the substrate such that if said shape of the linkage or said flexibility of said substrate is out of acceptable tolerance, said first electrode will not contact said second electrode when said defined level of voltage is applied to said first and second electrodes.

18. The testing device of claim 17, wherein said testing device is manufactured using the same manufacturing techniques as those used to manufacture the plurality of spaced-apart micro-mechanical or micro-electromechanical devices on the substrate.

19. The testing device of claim 18, wherein said testing device is manufactured concurrently with the plurality of devices on the substrate.

20. The testing device of claim 18, wherein said testing device is formed using conventional semi-conductor manufacturing equipment.

21. The testing device of claim 17, further including a handle wafer aligned substantially parallel to said substrate and operably secured to said substrate with a bonding layer extending between said handle wafer and said substrate.

22. A testing device for determining if micro-mechanical and micro-electromechanical devices formed using a flexible substrate have been manufactured within acceptable manufacturing tolerances, said device including:
- a linkage operably secured to said substrate and having a neutral position;
- a first electrode secured to said linkage;
- a second electrode operably secured to said substrate;
- a handle wafer aligned substantially parallel to said substrate and operably secured to said substrate with a bonding layer extending between said handle wafer and said substrate;
- said first electrode secured to said handle wafer by a first portion of said bonding layer, and said linkage is secured to said handle wafer by a second portion of said bonding layer; and,
- wherein said first electrode and said second electrode are spaced apart from each other in said neutral position and said linkage moves to allow said first electrode to contact said second electrode when a voltage at a defined level is applied to the first and second electrodes, said defined level of voltage being proportional to the shape of the linkage for a given flexibility of the substrate such that if said shape of the linkage or said flexibility of said substrate is out of acceptable tolerance, said first electrode will not contact said second electrode when said defined level of voltage is applied to said first and second electrodes.

23. The testing device of claim 22, wherein said first and second portions of bonding layer are conductive.

24. A method for testing the flexibility of a substrate and manufacturing tolerances used to build micro-mechanical and micro-electromechanical devices on that substrate, said method comprising the steps of:
- micro-machining a testing device on the substrate, said testing device having a pair of electrodes that short an electrical circuit when a threshold voltage is applied to them, said threshold voltage being proportional to the flexibility of the substrate and the overall shape and dimensions of the testing device such that said pair of electrodes will not short out the electrical circuit at said threshold voltage if said shape or dimensions of the linkage or said flexibility of said substrate are out of acceptable tolerance;
- applying the threshold voltage to the pair of electrodes on the testing device to determine if the electrical circuit shorts, thereby determining if one of the flexibility and the manufacturing techniques used on the substrate are out of acceptable tolerance.

25. The method for testing the flexibility of a substrate and manufacturing tolerances used to build micro-mechanical and micro-electromechanical devices on that substrate of claim 24, further including the step of micro-machining other micro-electromechanical or micromechanical components on the substrate using the same equipment used to micro-machine the testing device on the substrate.

26. The method for testing the flexibility of a substrate and manufacturing tolerances used to build micro-mechanical and micro-electromechanical devices on that substrate of claim 25, wherein said micro-machining a testing device on the substrate step and said micro-machining the other micro-mechanical and micro-electromechanical devices on the substrate step are performed concurrently.

27. The method for testing the flexibility of a substrate and manufacturing tolerances used to build micro-mechanical and micro-electromechanical devices on that substrate of claim 25, wherein said micro-machining a testing device on the substrate step and said micro-machining the other micro-mechanical and micro-electromechanical devices on the substrate step are performed using conventional semi-conductor manufacturing and handling equipment.

28. The method for testing the flexibility of a substrate and manufacturing tolerances used to build micro-mechanical and micro-electromechanical devices on that substrate of claim 27, wherein said conventional semi-conductor manufacturing and handling equipment includes masking portions of the substrate with etch resistant material, and etching the substrate to remove portions of the substrate and thereby form structures within the substrate.

29. The method for testing the flexibility of a substrate and manufacturing tolerances used to build micro-mechanical and micro-electromechanical devices on that substrate of claim 28, further including the steps of:
- operably securing the substrate to a handle wafer such that openings between the substrate and handle wafer are provided at defined locations; and,
- wherein said micro-machining a testing device on the substrate step includes aligning the moving portions of the testing device with the openings between the substrate and handle wafer such that the moving portions move freely.

30. The micro-electromechanical actuator manufactured into a substrate of claim 1, wherein said substrate is a silicon wafer having a plurality of micro-electromechanical devices thereon.

31. The micro-electromechanical actuator manufactured into a substrate of claim 1, wherein said first electrode and said second electrode are spaced apart from each other by a defined distance in said neutral position.

32. The micro-electromechanical actuator manufactured into a substrate of claim 31, wherein said defined distance is about 25 $\mu$m.

33. The micro-electromechanical actuator manufactured into a substrate of claim 31, wherein said micro-electromechanical actuator is formed on a non-essential portion of the substrate.

34. The micro-electromechanical actuator manufactured into a substrate of claim 33, wherein said substrate is a silicon wafer, and said non-essential portion of the substrate is a scribe line.

35. The testing device of claim 17, wherein the flexible substrate is substantially planar defining a plane, and said linkage is aligned to move along said plane of the substantially planar substrate.

36. The testing device of claim 35, wherein the linkage is formed with a plurality of substantially planar member, at least one member of said plurality of substantially planar members aligned substantially perpendicular to said plane.

37. The testing device of claim 36, wherein said plurality of substantially planar members are aligned substantially parallel with each other and operably secured together with spacer portions to define a substantially serpentine pattern thereby allowing the linkage to move along the plane of the substrate.

38. The testing device of claim 21, wherein said first electrode is secured to said handle wafer by a first portion of said bonding layer, and said linkage is secured to said handle wager by a second portion of said bonding layer.

39. The testing device of claim 38, wherein said first and second portions of said bonding layer are conductive.

* * * * *

UNITED STATES PATENT AND TRADEMARK OFFICE
CERTIFICATE OF CORRECTION

PATENT NO.     : 6,635,940 B1
DATED          : October 21, 2003
INVENTOR(S)    : Milligan It is certified that error appears in the above-identified patent and that said Letters Patent is hereby corrected as shown below:

<u>Column 8,</u>
Line 1, delete "Is" and insert therefor -- is --.

Signed and Sealed this

Twenty-second Day of June, 2004

JON W. DUDAS
*Acting Director of the United States Patent and Trademark Office*